(12) United States Patent
Ahsan et al.

(10) Patent No.: US 7,612,371 B2
(45) Date of Patent: Nov. 3, 2009

(54) STRUCTURE TO MONITOR ARCING IN THE PROCESSING STEPS OF METAL LAYER BUILD ON SILICON-ON-INSULATOR SEMICONDUCTORS

(75) Inventors: Ishtiaq Ahsan, Wappingers Falls, NY (US); Christine M. Bunke, Fishkill, NY (US); Stephen E. Greco, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 11/306,944

(22) Filed: Jan. 17, 2006

(65) Prior Publication Data

US 2007/0164421 A1 Jul. 19, 2007

(51) Int. Cl.
*H01L 23/58* (2006.01)
(52) U.S. Cl. .................... 257/48; 257/127; 257/170; 257/409; 257/484; 257/605; 257/E29.012; 257/E29.013
(58) Field of Classification Search ............ 257/48
See application file for complete search history.

(56) References Cited

U.S. PATENT DOCUMENTS 5,548,224 A * 8/1996 Gabriel et al. ............ 324/765

| | | |
|---|---|---|
| 5,691,234 A | 11/1997 | Su et al. |
| 6,013,927 A | 1/2000 | Bothra et al. |
| 6,048,761 A | 4/2000 | En |
| 6,093,626 A | 7/2000 | Su et al. |
| 6,277,708 B1 | 8/2001 | Bothra et al. |
| 6,448,599 B1 | 9/2002 | Wang |
| 6,586,765 B2 * | 7/2003 | Lin et al. ............ 257/48 |
| 6,680,216 B2 * | 1/2004 | Kwasnick et al. ........ 438/57 |
| 6,686,254 B2 | 2/2004 | Petrucci et al. |
| 6,830,963 B1 * | 12/2004 | Forbes ............... 438/149 |
| 2002/0063298 A1 | 5/2002 | Wang |

* cited by examiner

*Primary Examiner*—Minh-Loan T Tran
*Assistant Examiner*—Fei Fei Yeung Lopez
(74) *Attorney, Agent, or Firm*—DeLio & Peterson, LLC; Kelly M. Nowak; Yuanmin Cai

(57) ABSTRACT

The present invention addresses detection of charge-induced defects through test structures that can be easily incorporated on a wafer to detect charge-induced damage in the back-end-of-line processing of a semiconductor processing line. A test macro is designed to induce an arc from a charge accumulating antenna structure to another charge accumulating antenna structure across parallel plate electrodes. When an arc of a predetermined sufficient strength is present, the macro will experience a voltage breakdown that is measurable as a short. The parallel plate electrodes may both be at the floating potential of the microchip to monitor CMP-induced or lithographic-induced charge failure mechanisms, or have one electrode electrically connected to a ground potential structure to capture charge induced damage, hence having the capability to differentiate between the two.

11 Claims, 5 Drawing Sheets

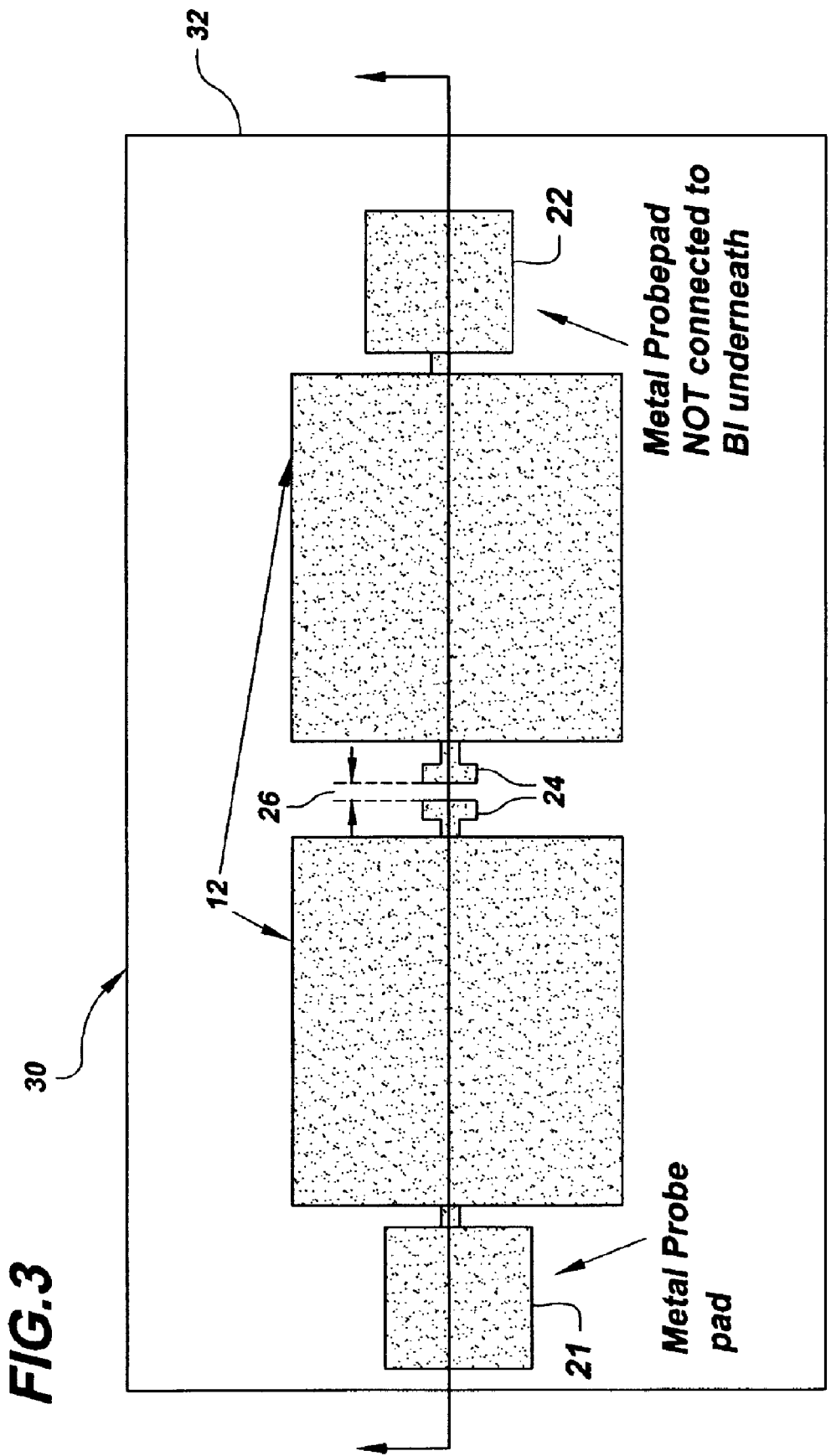

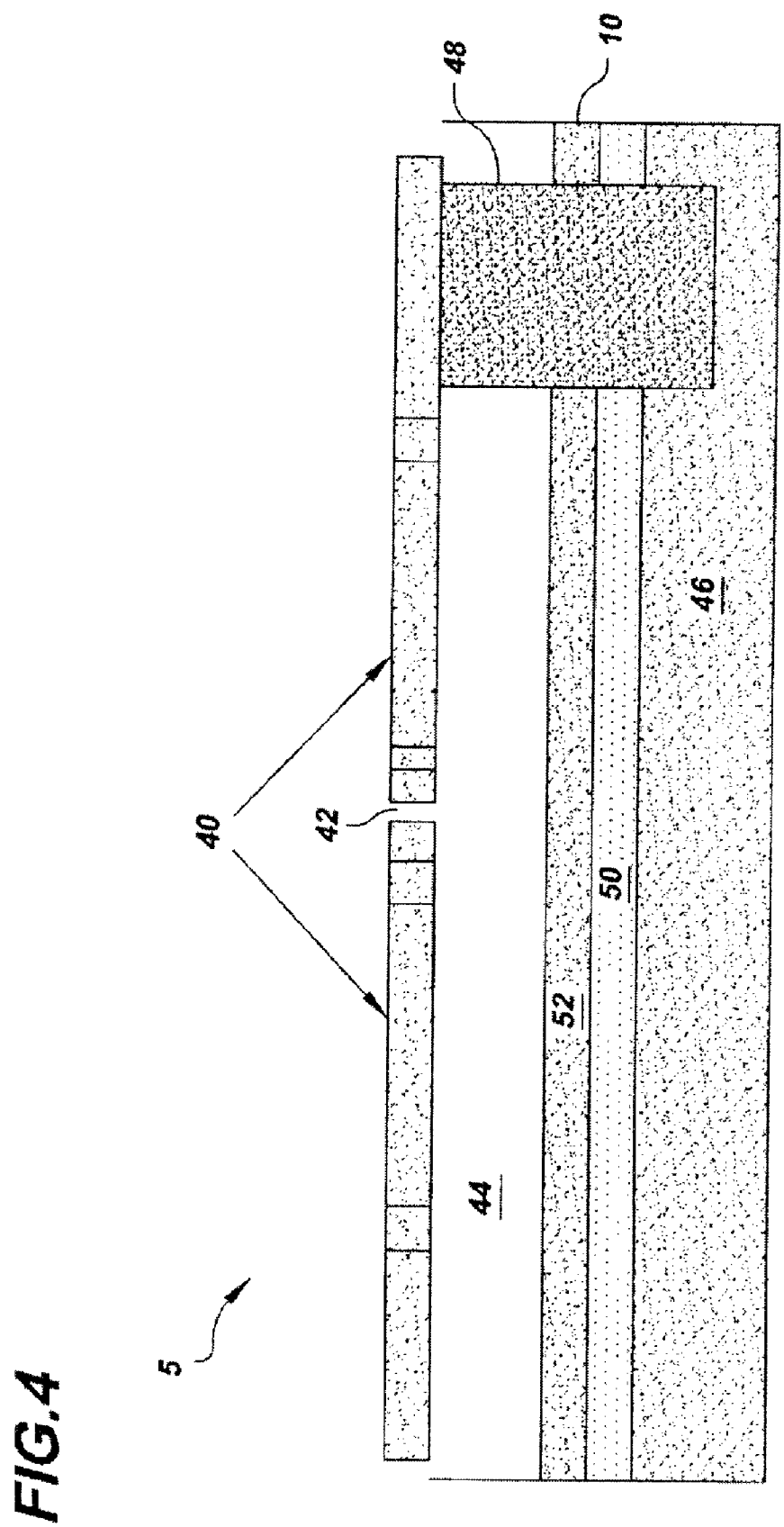

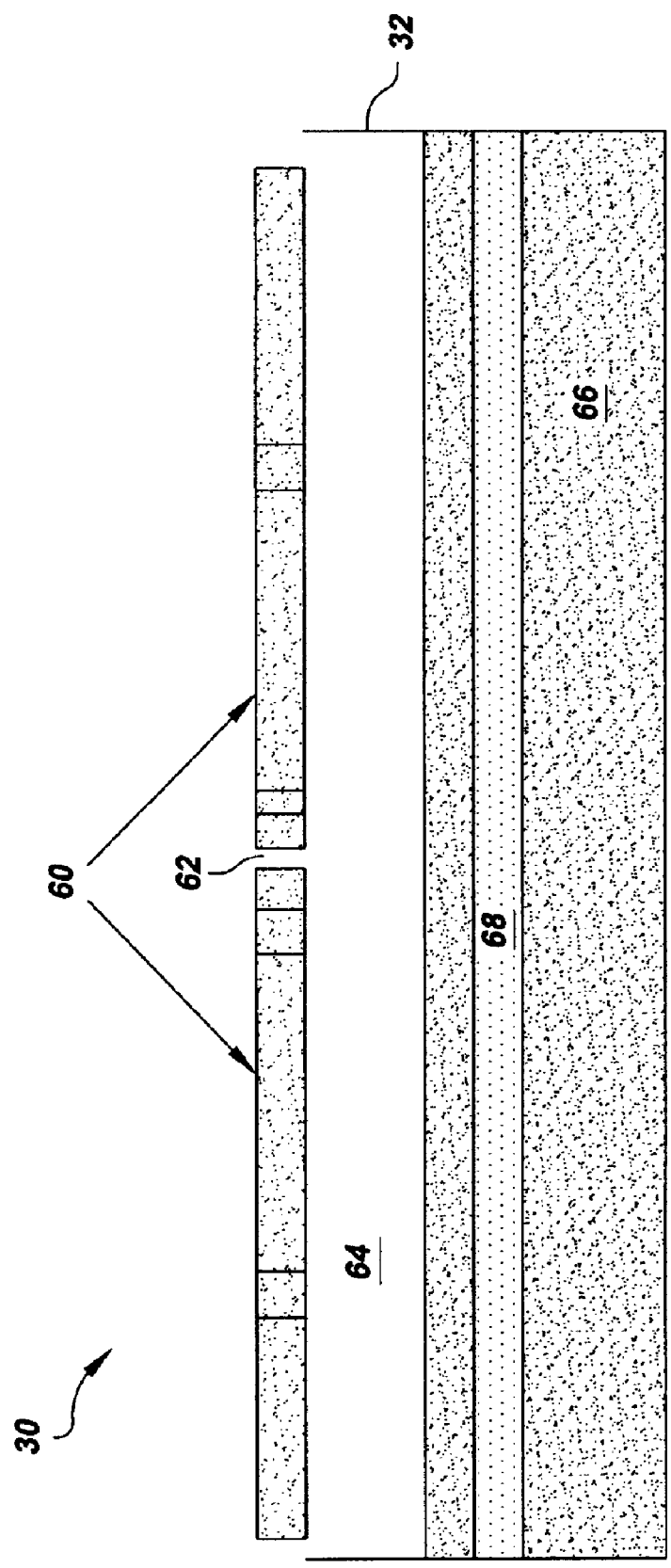

STRUCTURE TO MONITOR ARCING IN THE PROCESSING STEPS OF METAL LAYER BUILD ON SILICON-ON-INSULATOR SEMICONDUCTORS

BACKGROUND OF THE INVENTION

1. Field of the Invention

The field of the invention relates to semiconductor technology, and specifically to structure to monitor arcing between metal layers. More specifically, the present invention addresses charge-induced defects through adequate test structures that can be easily implemented in back-end-of-line processing.

2. Description of Related Art

Integrated circuit chips are exposed to various potential differences during processing making them vulnerable to charge induced damage. For example, silicon-on-insulator (SOI) technology in 300 mm semiconductor fabrication is prone to arcing damage and shorting. The primary problem from this phenomenon is defects caused by sprays of foreign material (debris) and the discharge damage itself. Damage to gates within the chip may also cause the chip to be nonfunctional. One of the mechanism by which charge accumulated on the wafer in the SOI technologies are discharged is generally through a guard ring, which is connected to the substrate and thus ground via the body (BI) contact through the buried oxide layer. The potential difference created by both the floating circuit net and the crack stop, which is connected to the substrate through the BI contact, increases as thicker dielectric stacks are fabricated through back-end-of-line (BEOL) processing. The greater potential build-up causes arcing or dielectric breakdown between the layers that typically results in electrical shorting and damage.

The primary method of detecting this type of charge damage has been historically through expensive and time-consuming optical inspection techniques. Since the defect normally manifests itself as an intermittent problem, it is difficult without testing to diagnosis a large sample size of components. Furthermore, the defect is generally detectable with optical inspection only if a large discharge is generated. More subtle problems will often remain undetected. Consequently, there remains a need in the industry to provide a test structure that allows the discharge to be detected more readily through standard in-line test methods.

Charge damage has been a key yield detractor in 90 nm technology. The absence of a suitable structure for monitoring this yield-detracting mechanism through electrical test prevents a manufacturer from employing an early detection scheme. As such, the manufacture is often unaware of the problem until a significant amount of hardware has been impacted by this failure mode. The present invention attempts to address charge-induced defects through adequate test structures that can be easily implemented.

SUMMARY OF THE INVENTION

Bearing in mind the problems and deficiencies of the prior art, it is therefore an object of the present invention to provide a test structure macro to initiate arcing-induced failures and allow for measurements thereof.

It is another object of the present invention to provide a test structure macro to monitor charge-induced arcing and shorting from the microcircuit chip to the guard ring.

A further object of the invention is to provide a test structure macro to monitor charge-induced arcing and shorting across different segments of a floating microcircuit chip so that one can differentiate between a charge-damage induced shorting and shorting induced due to other reasons.

Still other objects and advantages of the invention will in part be obvious and will in part be apparent from the specification.

The above and other objects, which will be apparent to those skilled in the art, are achieved in the present invention, which is directed to a test structure for monitoring discharges during semiconductor wafer processing comprising: a parallel plate electrode having a first electrode plate electrically connected on one end to a first metal structure, and a second electrode plate adjacent the first electrode plate, connected on one end to a second metal structure; a first metal probe pad electrically connected to the first metal structure; a second metal probe pad electrically connected to the second metal structure; such that charge is accumulated on the metal structures and a conductive circuit is established between the probe pads after arcing occurs across the parallel plate electrode. The test structure further comprises electrically connecting an opposite end of the second metal probe pad to a ground potential structure. The ground potential structure may include a guard ring. The test structure may also include a dielectric between the parallel plate electrodes. Spacing between the parallel plate electrode plates is selected to adjust for arcing.

In a second aspect, the present invention is directed to a test structure for monitoring discharges during semiconductor wafer processing comprising: a first metal probe pad having an electrical connection to a first metal antenna structure on the semiconductor wafer; and a second metal probe pad having an electrical connection on the semiconductor wafer to a second metal antenna structure: a first parallel plate electrode having an electrical connection to the first metal antenna structure, and a second parallel plate electrode having an electrical connection to the second metal antenna structure, the second parallel plate electrode adjacent the first parallel plate electrode, such that the parallel plate electrodes form a conductive path between the first and second metal probe pads when charge accumulates on the metal antenna structures and an arc occurs. The test structure may further include the first and second metal probe pads and the first and second metal antenna structures fabricated using techniques from the semiconductor wafer processing and capable of being electrically monitored during and after the processing The metal antenna structures may be fabricated on the wafer and held at a floating voltage potential.

In a third aspect, the present invention is directed to a test structure for monitoring discharges during semiconductor wafer processing comprising: a first parallel plate electrode electrically connected on one end to a first metal plate antenna; and a second parallel plate electrode electrically connected on one end to a second plate antenna; a first metal probe pad connected to the first metal plate antenna; and a second metal probe pad connected to the second metal plate antenna; the parallel plate electrodes adjacent one another forming a path for arcing therebetween.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 3 depicts a second test structure macro for measuring CMP-induced and/or lithographic-induced shorts.

FIG. 4 depicts a cross-sectional view of the first test structure macro fabricated on a layered wafer.

FIG. 5 depicts a cross-sectional view of the second test structure macro fabricated on a layered wafer.

DESCRIPTION OF THE PREFERRED EMBODIMENT(S)

In describing the preferred embodiment of the present invention, reference will be made herein to FIGS. 1-5 of the drawings in which like numerals refer to like features of the invention.

Charge-induced damage is a common phenomenon in the back-end-of-line processing steps in a semiconductor processing line. Charging mechanisms in silicon-on-insulator (SOI) wafers are different from those on bulk wafers since in SOI wafers there are many circuits where the body of transistors, such as MOSFETs, are generally at a floating potential. Different types of back-end-of-line charging damage have been observed during the manufacture of SOI wafers. One such type is charge damage near the guard ring of the product. This damage is generally observed by inspection, and is usually later confirmed by Transfer Electron Microscope (TEM), a high resolution, time consuming, expensive microscopy. The confirmation, however, cannot be performed in-situ, and is an inefficient way to verify the failure. In many instances, multiple failures are manifested within a production lot before charge-induced failures can be identified and corrected. Charge-induced damage is of particular interest since the guard ring is one of the largest metal layers connected to the SOI wafer through the body (BI) contact. The observed failure mechanism is an arcing between the guard ring and the other metal layers of the chip, ultimately causing a conductive carbon trace, which in turn forms an electrical short. This finding indicates that it is more probable for the body of the SOI wafer to contact the large metal layers than other floating body structures, making the device more susceptible to arcing and charging.

Test macros are monitor structure designed to detect failure mechanisms of the product chip before the actual chip is fully built. These usually happen to be much smaller in size and much more simple in design, but are designed in a way so that their design is sensitive to particular types of failure mechanisms. These special designs for test macros make it easy to detect particular types of failure mechanisms, whereas, the product chip may lack similar diagnostic features for narrowing down to a particular failure mechanism for chip failures.

Figure 1A:
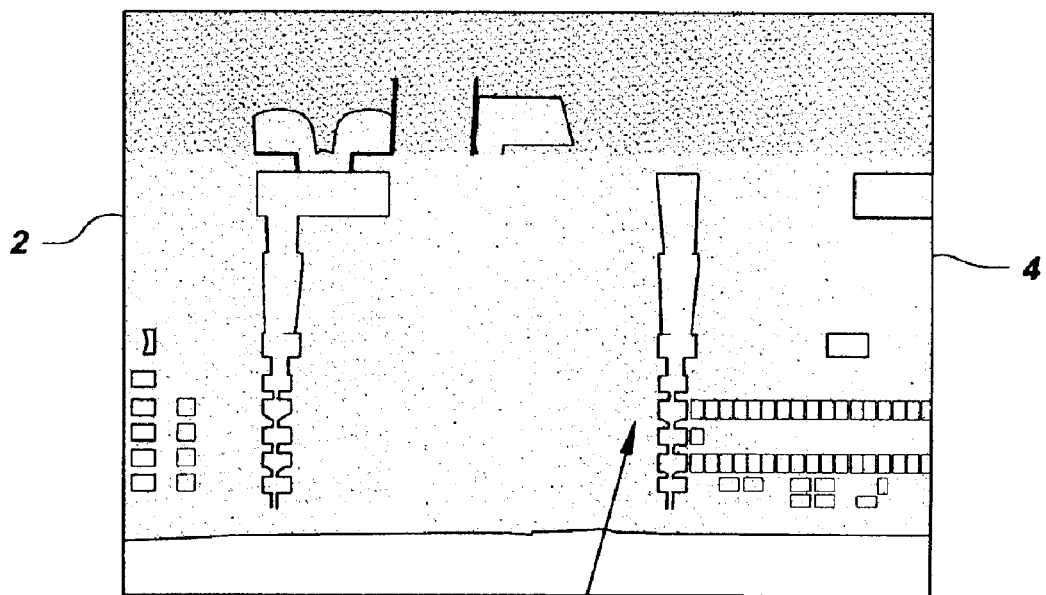
FIG. 1A depicts an SOI wafer having multiple layers and a plurality of gate structures.
Figure 1B:
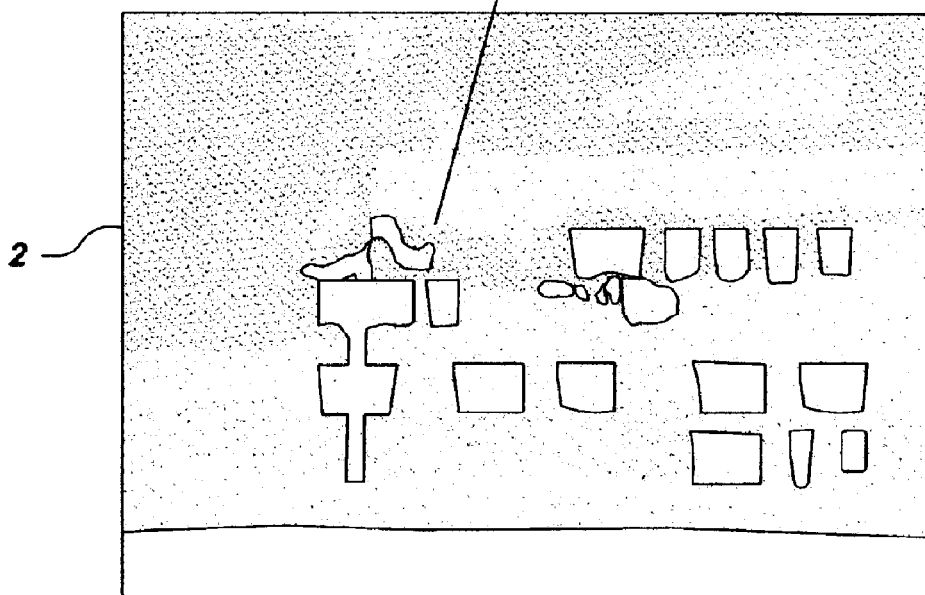
FIG. 1B depicts a magnification of the gate structure of the SOI wafer of FIG. 1A after arcing-induced damage.

FIG. 1A depicts an SOI wafer 2 having multiple layers and a plurality of gate structures 4. FIG. 1B depicts a magnification of gate structure 4 of the SOI wafer of FIG. 1A after arcing-induced damage. As shown, the top portion of gate structure 4 is obliterated by the arc. Arrow A correlates the gate structure 4 of FIG. 1A to the same damaged gate structure depicted in FIG. 1B.

Since most test macros in SOI technology are floating-body macros, they will generally not exhibit an electrical signature of this failure mechanism. As a result, any arc-induced short to ground would go undetected during macro testing. Therefore, it is necessary to induce this failure mode by designing a macro that is sensitive to arcing to understand and address the root cause. The present invention proposes a macro particularly designed to induce an arc to ground. In this manner, if an arc of a predetermined strength is present, the macro will experience a voltage breakdown that is measurable as a short. The test circuit is easily adapted to measure this short. By regulating the dimensions and characteristics of the test circuit and calculating the total number or percentage of these fails, a determination may then be made regarding the presence of an arc of sufficient strength to damage the circuit.

Figure 2:
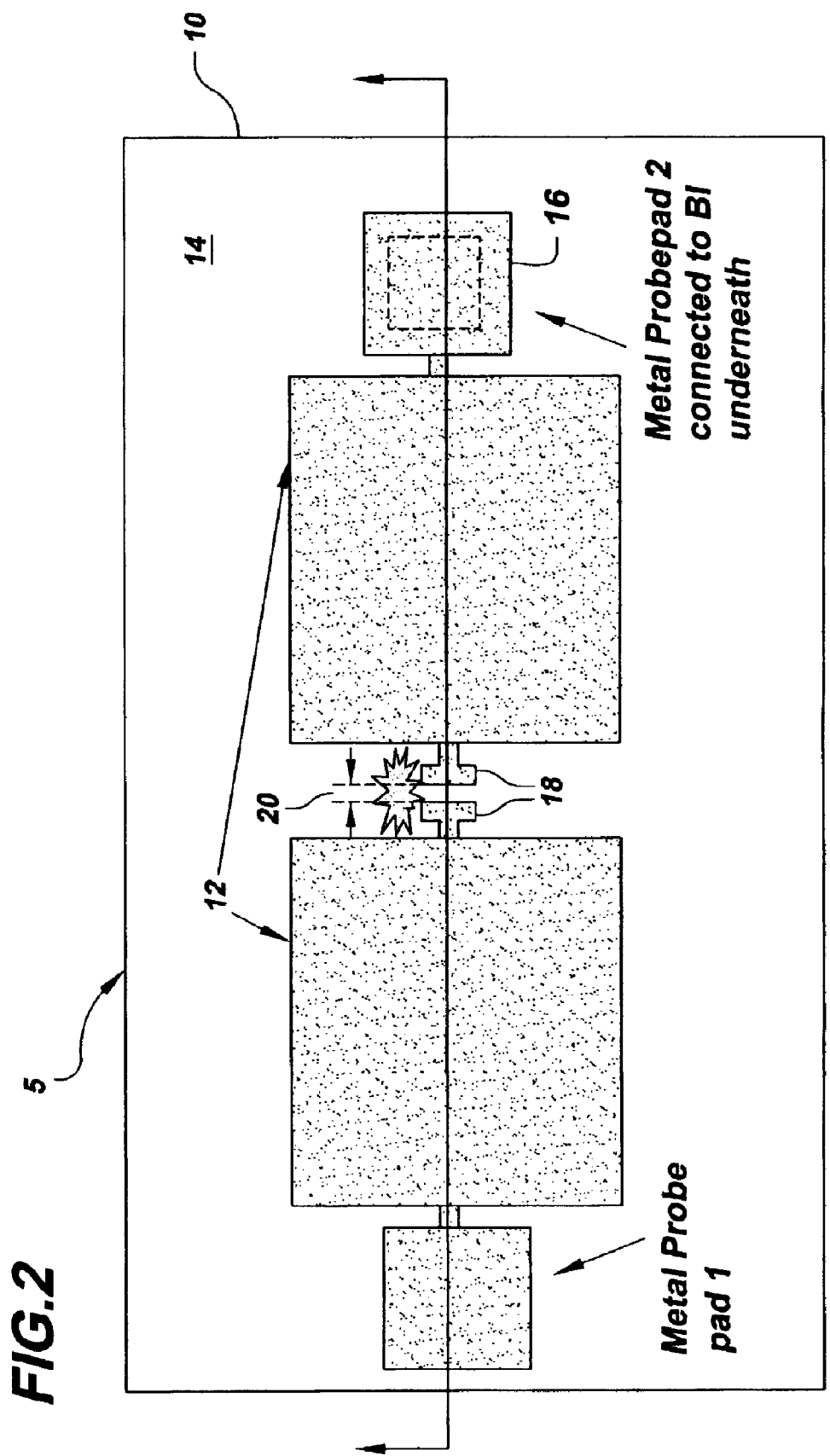
FIG. 2 depicts an arc-inducing test structure macro of the present invention.

FIG. 2 depicts an arc-inducing macro 5 of the present invention. A top view of wafer 10 is shown with metal plates 12 on top surface 14. These metal plates act as an "antenna" and provide a large area for charge to accumulate before it can discharge through the thin metal lines forming parallel plate electrodes 18 for causing an arc. Two metal probe pads 1, 2 are connected to metal plates 12. Metal probe pad 2 is electrically connected to the BI (not shown) located underneath top surface 14. Preferably, the electrical connection is made by constructing an array of vias 16 within probe pad 2 to the guard ring. The two parallel plate electrodes 18 separate the two large metal plates 12, and act as "arcing electrodes". The gap distance 20 and type of dielectric between parallel plates 18 are predetermined such that arcs of certain strength (voltage) will breakdown and cause a short between the plates, while arcs of less strength will not breakdown. The predetermined breakdown voltage is calculated to be capable of registering a short across parallel plates 18 if an arc occurs, and correspondingly sufficient to damage circuitry on the chip. Test circuitry is designed to contact and measure the resistance of probe pad 1 with respect to probe pad 2. If an arc of sufficient strength has exceeded the breakdown voltage of gap 20, a short will occur within the dielectric. The continuity between probe pad 1 and newly shorted probe pad 2 is measurable, making the arc damage detectable.

The proposed macro is accomplished by having one metal plate connected to the SOI wafer body through the body (BI) contact while holding a second plate at a floating potential. Any shorting due to arcing between the plates will be empirically measured by electrically testing the structure for a short. This scheme represents a much more powerful detection scheme than PLY testing since the proposed test may be performed on every lot and over many sites, while PLY tests can only be performed on a limited number of wafers. Additionally, PLY tests are much less cost efficient. The proposed scheme is more likely to observe subtle defects that a PLY inspection would generally miss.

To distinguish an arcing-induced short from a chemical-mechanical-polishing (CMP)-induced or lithographic-induced short, the present invention employs a second test structure macro 30, preferably fabricated in close proximity to the first macro test structure. FIG. 3 depicts second test structure macro 30 for measuring CMP-induced and/or lithographic-induced shorts. In second test structure macro 30, both metal probe pads 21, 22 are held at a floating potential on wafer 32. Once again, a parallel plate electrode 24 is configured between metal plates 12. The parallel plates 24 are separated by gap 26 at a predetermined distance, having a known dielectric therebetween, such that an arc of sufficient strength will breakdown and cause a short. However, because the probe pads are floating, any arcing or shorting must mimic an arc formed on the chip surface between chip circuitry held at a floating potential, and not between the chip circuitry and the guard ring or ground.

Both of the test macro structures 5, 30 are prone to the same CMP-induced or lithographic-induced shorting mechanism; however, test structure macro 5 having one end of its parallel plates connected to the guard ring will be more prone to arcing-induced shorting. The yield delta between these two test schemes provides information of the extent of the arcing-induced or charging-induced shorts.

In the second test structure macro 30, metal probe pad 22 is not connected to the substrate. However, the two metallic plates 12 could still be shorted out due to a non-arcing related failure mechanism. This ultimately creates a shorting mechanism between the pads. This could happen in macro 5 as well, even in the absence of any arcing damage. If that indeed happens then the difference in the percentage or number of fails between macros 30 and 5 will give information regarding the damage done solely due to arcing and charge damage related failure mechanism, since macro 5 is prone to both arching-related and litho- and CMP-related failure mechanism, but macro 30 is prone to CMP- and litho-related failure mechanisms only.

FIG. 4 depicts a cross-sectional view of the first test structure macro 5 on layered wafer 10. A top metal wire surface layer 40 is shown with a gap 42 therebetween. An insulator layer 44 supports metal wire surface layer 40 and resides underneath it. The insulating material fills gap 42 and provides the requisite dielectric breakdown characteristic for the gap. One segment of metal wire surface layer 40 is held at the same potential as the chip (not shown) on the wafer, while another segment of metal wire surface layer 40 connects to the body (BI) silicon layer 46 through via 48. This connection represents the grounding of one side of the parallel plate capacitor to ground potential, which is equivalent of that of the guard ring. An SOI layer 50 is located between silicon layer 52 and silicon layer 46.

FIG. 5 depicts a cross-sectional view of the second test structure macro 30 on layered wafer 32. Top metal wire surface 60 is shown with a gap 62 therebetween. As similarly depicted in the first test structure macro, an insulating layer 64 supports the metal wire surface 60. However, in this macro, there is no via to electrically connect on segment of metal wire surface 60 to the body silicon layer 66, which would otherwise depict an electrical connection to ground potential and is equivalent to the potential of the guard ring. In this embodiment, each segment of top metal wire surface 60 is floating with respect to silicon layer 66 or SOI layer 68. In this manner, CMP-induced or lithographic-induced failure mechanisms are modeled and detected by the parallel plate macro with its floating electrodes.

The dual test structure macros may be used collectively as a vehicle to develop a new BEOL process and to define various ground rules of a new technology, as well as an excellent in-line monitor for the production of wafers.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A test structure for inducing discharges during semiconductor wafer processing comprising:
   a planar parallel plate electrode having a first electrode plate comprising thin metal lines forming a first arcing electrode plate electrically connected on one end to a first metal structure comprising a first metal plate antenna, and a second electrode plate comprising thin metal lines forming a second arcing electrode plate adjacent said first electrode plate and having a gap distance from said first electrode plate, said second electrode plate connected on one end to a second metal structure comprising a second metal plate antenna;
   a dielectric between said first electrode plate and said second electrode plate, wherein said gap distance and said dielectric are predetermined such that arcs of predetermined strength will breakdown during testing and cause a short across said parallel plate electrode, said short of sufficient strength to damage circuitry on said wafer, while arcs of less strength will not break down during testing;
   a first metal probe pad, planar with said parallel plate electrode, electrically connected to said first metal plate antenna;
   a second metal probe pad, planar with said parallel plate electrode and said first metal probe pad, electrically connected to said second metal plate antenna;
   whereby said first and second metal plate antennas have a larger area than both said first and second arcing electrode plates and said first and second metal probe pads to accumulate charge thereon before it can discharge through said first and second arcing electrode plates for causing an arc and establishing a conductive circuit between said probe pads after arcing occurs across said parallel plate electrode.

2. The test structure of claim 1 further comprising electrically connecting an opposite end of said second metal probe pad to a ground potential structure.

3. The test structure of claim 2 wherein said ground potential structure includes a guard ring.

4. The test structure of claim 1 wherein said semiconductor wafer comprises silicon on insulator (SOI) technology.

5. The test structure of claim 1 wherein said dielectric has a selected characteristic breakdown voltage.

6. The test structure of claim 1 further comprising said first and second metal probe pads and said first and second metal plate antennas capable of being electrically monitored during and after semiconductor wafer processing.

7. The test structure of claim 1 wherein said first and second metal plate antennas are fabricated on said wafer and held at a floating voltage potential.

8. The test structure of claim 1 wherein spacing between said first and second plate electrodes is selected to adjust said first and second plate electrodes for arcing.

9. The test structure of claim 1 wherein each layer of said semiconductor wafer has said test structure associated therewith.

10. The test structure of claim 9 wherein said first and second metal plate antennas are held at a floating potential between layers of said semiconductor wafer.

11. The test structure of claim 1 wherein said predetermined arc strength is calculated to register a short across said parallel plate electrode if an arc occurs, and is of a magnitude capable of damaging circuitry on the chip.

* * * * *